US008361598B2

(12) United States Patent
Daubenspeck et al.

(10) Patent No.: US 8,361,598 B2
(45) Date of Patent: Jan. 29, 2013

(54) SUBSTRATE ANCHOR STRUCTURE AND METHOD

(75) Inventors: Timothy Harrison Daubenspeck, Colchester, VT (US); Jeffrey Peter Gambino, Westford, VT (US); Christopher David Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/985,456

(22) Filed: Jan. 6, 2011

(65) Prior Publication Data

US 2011/0100685 A1    May 5, 2011

Related U.S. Application Data

(62) Division of application No. 11/924,662, filed on Oct. 26, 2007, now Pat. No. 7,935,408.

(51) Int. Cl.
*B32B 3/10* (2006.01)
*B32B 5/12* (2006.01)
*H01L 23/485* (2006.01)
*H01L 23/488* (2006.01)

(52) U.S. Cl. ........ 428/162; 428/137; 428/138; 428/139; 428/140; 428/164; 428/172; 428/901; 257/737; 257/777; 257/778; 257/779; 257/780; 257/781; 257/E23.021; 257/E21.508; 174/259; 174/263; 438/455; 29/592.1; 29/825; 29/877; 29/884

(58) Field of Classification Search ........................ None
See application file for complete search history.

(56) References Cited

U.S. PATENT DOCUMENTS

| 4,917,286 | A |   | 4/1990  | Pollacek       |         |
|-----------|---|---|---------|----------------|---------|
| 5,136,366 | A |   | 8/1992  | Worp et al.    |         |
| 5,291,374 | A |   | 3/1994  | Hirata et al.  |         |
| 5,697,148 | A |   | 12/1997 | Lance, Jr. et al. |      |
| 5,844,782 | A |   | 12/1998 | Fukasawa       |         |
| 5,855,993 | A |   | 1/1999  | Brady et al.   |         |
| 5,897,374 | A |   | 4/1999  | Lin            |         |
| 5,943,597 | A |   | 8/1999  | Kleffner et al.|         |
| 5,973,931 | A |   | 10/1999 | Fukasawa       |         |
| 6,011,301 | A |   | 1/2000  | Chiu           |         |
| 6,096,649 | A | * | 8/2000  | Jang ............................. | 438/687 |
| 6,133,136 | A |   | 10/2000 | Edelstein et al.|        |

(Continued)

FOREIGN PATENT DOCUMENTS

JP    2006222375 A  *  8/2006
JP    2006269971 A  *  10/2006

OTHER PUBLICATIONS

English Abstract for JP 2006222375 A, Aug. 2006.*

(Continued)

*Primary Examiner* — Maria Veronica Ewald
*Assistant Examiner* — Jeff Vonch
(74) *Attorney, Agent, or Firm* — Schmeiser, Olsen & Watts; Richard Kotulak

(57) ABSTRACT

An electrical structure and method of forming. The electrical structure includes a first substrate, a first dielectric layer, an underfill layer, a first solder structure, and a second substrate. The first dielectric layer is formed over a top surface of the first substrate. The first dielectric layer includes a first opening extending through a top surface and a bottom surface of said first dielectric layer. The first solder structure is formed within the first opening and over a portion of the top surface of said first dielectric layer. The second substrate is formed over and in contact with the underfill layer.

12 Claims, 12 Drawing Sheets

U.S. PATENT DOCUMENTS

| | | |
|---|---|---|
| 6,376,354 B1 | 4/2002 | Yih |
| 6,387,795 B1 | 5/2002 | Shao |
| 6,426,281 B1 | 7/2002 | Lin et al. |
| 6,448,504 B1 | 9/2002 | Taguchi |
| 6,483,190 B1 * | 11/2002 | Kainuma et al. .............. 257/737 |
| 6,518,665 B1 | 2/2003 | Westby et al. |
| 6,528,417 B1 | 3/2003 | Wang et al. |
| 6,558,981 B2 | 5/2003 | Jimarez et al. |
| 6,573,538 B2 | 6/2003 | Motsiff et al. |
| 6,596,619 B1 * | 7/2003 | Wang et al. .................... 438/612 |
| 6,650,022 B1 | 11/2003 | Qi et al. |
| 6,656,826 B2 | 12/2003 | Ishimaru |
| 6,657,130 B2 | 12/2003 | Van Dyke et al. |
| 6,724,084 B1 * | 4/2004 | Hikita et al. .................. 257/737 |
| 6,811,853 B1 | 11/2004 | Sherrer et al. |
| 6,897,127 B2 | 5/2005 | Hanaoka |
| 6,919,642 B2 * | 7/2005 | Hsieh et al. ................... 257/778 |
| 6,943,059 B2 | 9/2005 | Maeda |
| 6,958,527 B2 | 10/2005 | Hanaoka |
| 6,982,225 B2 | 1/2006 | Bohr |
| 6,998,718 B2 | 2/2006 | Chang et al. |
| 7,026,234 B2 * | 4/2006 | Jao et al. ...................... 438/613 |
| 7,126,164 B2 | 10/2006 | Johnson et al. |
| 7,176,583 B2 | 2/2007 | Daubenspeck et al. |
| 7,242,093 B2 * | 7/2007 | Ueda ............................. 257/737 |
| 7,358,608 B2 | 4/2008 | Ohsumi |
| 7,518,211 B2 | 4/2009 | Jao |
| 7,579,694 B2 | 8/2009 | Jan et al. |
| 7,935,408 B2 * | 5/2011 | Daubenspeck et al. ........ 428/137 |
| 2003/0071354 A1 | 4/2003 | Tsai et al. |
| 2004/0004292 A1 * | 1/2004 | Hsieh et al. ................... 257/778 |
| 2004/0222521 A1 * | 11/2004 | Hikita et al. .................. 257/737 |
| 2005/0012210 A1 | 1/2005 | Ohsumi |
| 2005/0070083 A1 | 3/2005 | Johnson et al. |
| 2005/0104226 A1 | 5/2005 | Chang et al. |
| 2005/0116354 A1 * | 6/2005 | Kashiwazaki ................ 257/779 |
| 2006/0016861 A1 * | 1/2006 | Daubenspeck et al. .. 228/180.21 |
| 2006/0068595 A1 | 3/2006 | Seliger et al. |
| 2006/0180928 A1 * | 8/2006 | Takahira ....................... 257/737 |
| 2006/0231951 A1 | 10/2006 | Jan et al. |
| 2006/0249844 A1 | 11/2006 | Yang |
| 2007/0108623 A1 | 5/2007 | Jao |
| 2007/0200234 A1 | 8/2007 | Gerber et al. |
| 2008/0142968 A1 | 6/2008 | Jadhav et al. |

OTHER PUBLICATIONS

English Abstract for JP 2006269971 A, Oct. 2006.*
Notice of Allowance (Mail Date: Dec. 23, 2010) for U.S. Appl. No. 11/924,662, filed Oct. 26, 2007; Confirmation No. 1648.

* cited by examiner

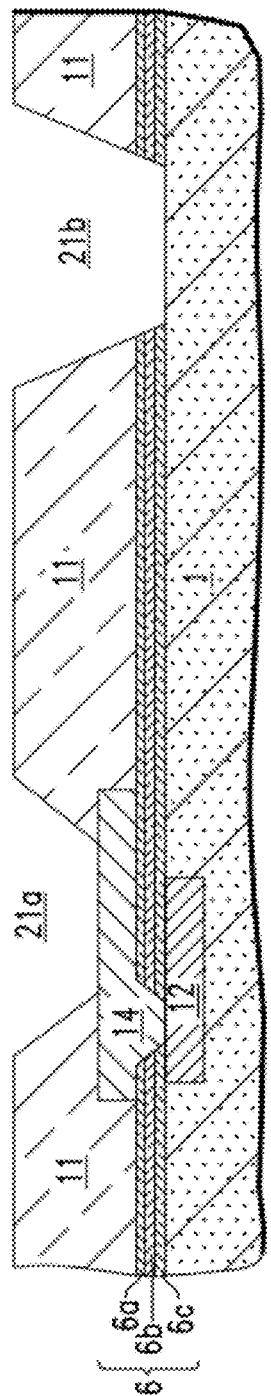
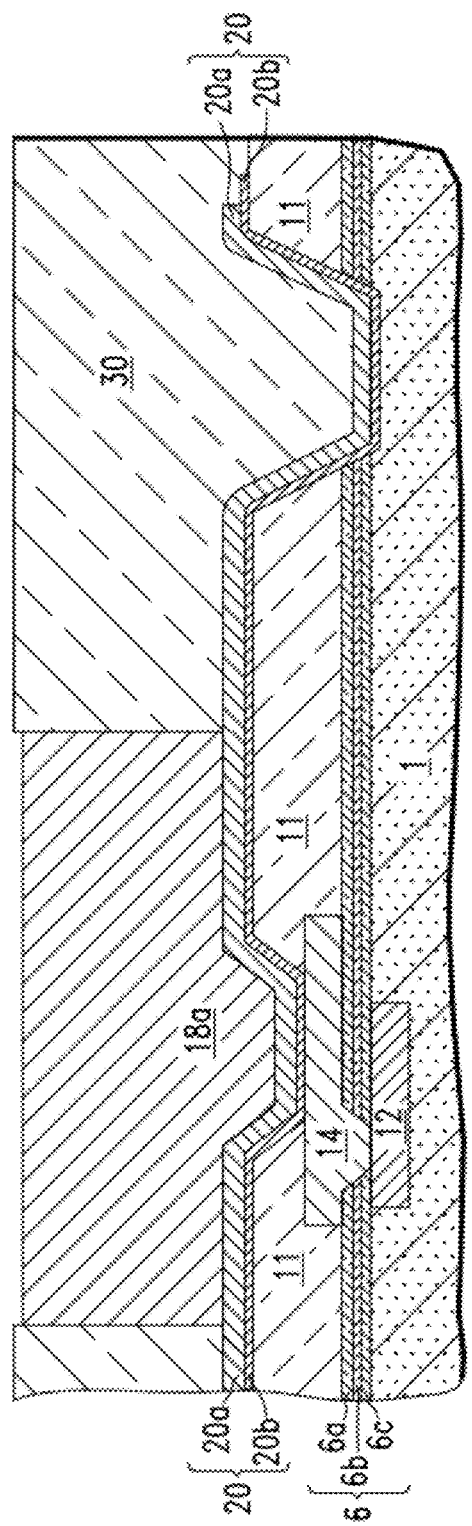
FIG. 7A
FIG. 7B

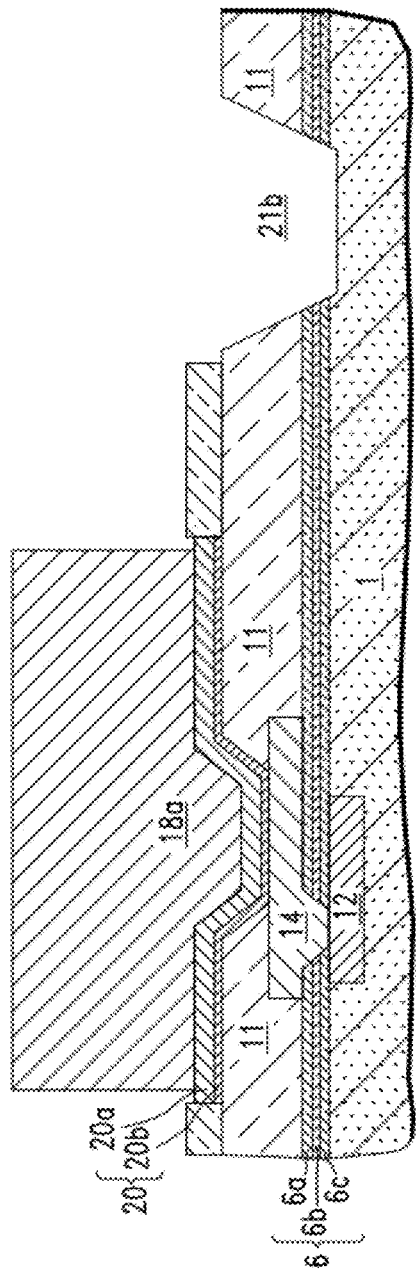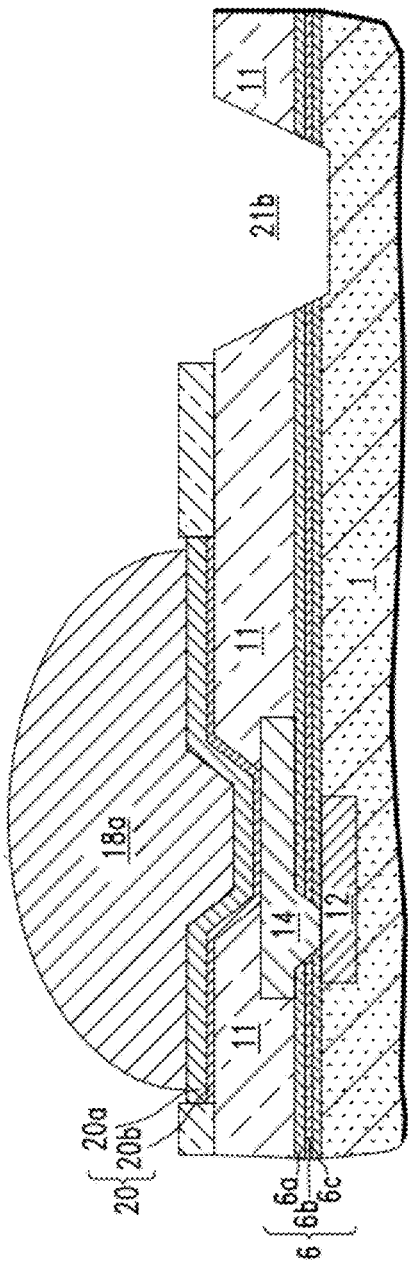

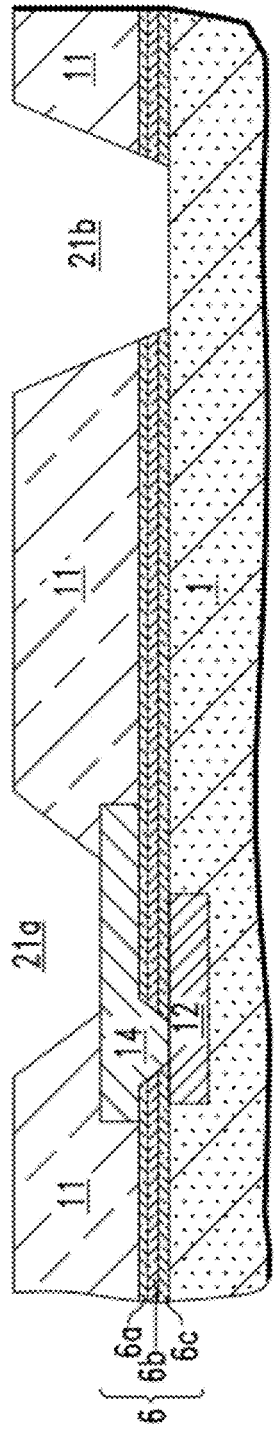
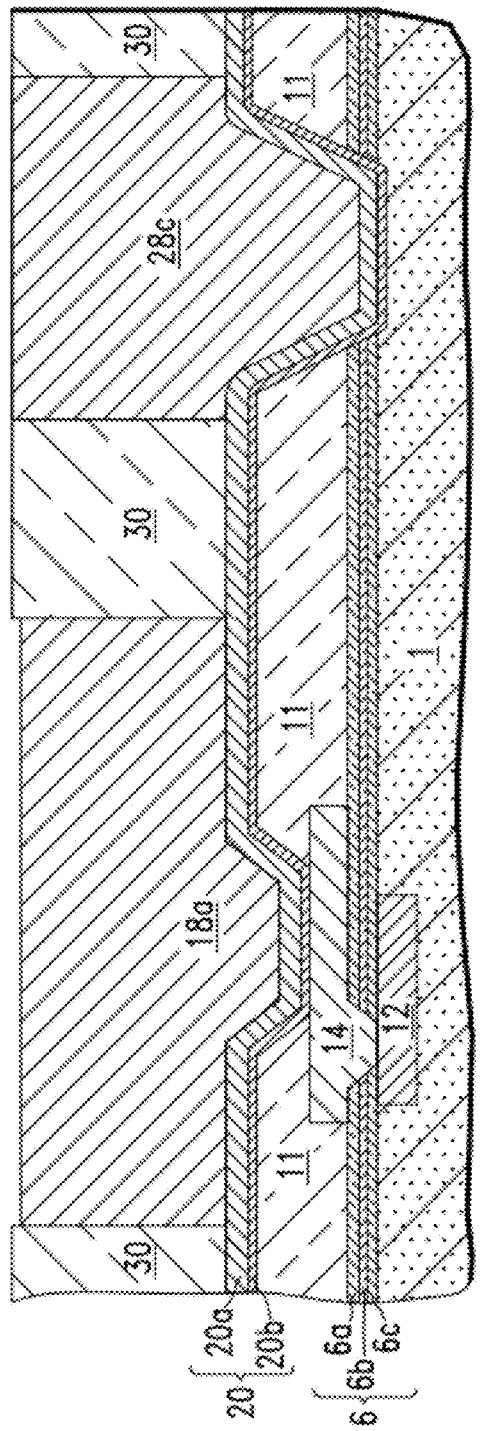

SUBSTRATE ANCHOR STRUCTURE AND METHOD

This application is a divisional application claiming priority to Ser. No. 11/924,662, filed Oct. 26, 2007, now U.S. Pat. No. 7,935,408, issued May 3, 2011.

FIELD OF THE INVENTION

The present invention relates to a substrate anchor structure and associated method for forming a substrate anchor structure.

BACKGROUND OF THE INVENTION

Connections between structures typically do not comprise any additional means of support and are therefore typically unreliable and subject to failure. Accordingly, there exists a need in the art to overcome at least one of the deficiencies and limitations described herein above.

SUMMARY OF THE INVENTION

The present invention provides an electrical structure comprising:
   a first substrate;
   a first dielectric layer formed over a top surface of said first substrate, wherein said first dielectric layer comprises a first opening extending from a top surface through a bottom surface of said first dielectric layer;
   a first solder structure formed within said first opening and over a portion of said top surface of said first dielectric layer, wherein said first solder structure comprises a solder material, wherein said first solder structure is not electrically connected to said first substrate;
   an underfill layer comprising a silica-epoxy composite adhesive material, wherein said underfill layer is formed over said top surface of said first dielectric layer and over said first solder structure; and
   a second substrate formed over and in contact with said underfill layer, wherein said second substrate is not in contact with said first solder structure.

The present invention provides a method for forming an electrical structure comprising:
   providing a first substrate and a second substrate;
   forming a electrically conductive pad formed within said first substrate, wherein said electrically conductive pad comprises a metallic pad;
   forming a passivation layer over and in direct mechanical contact with a top surface of said first substrate, wherein said passivation layer comprises a first independent layer formed over and in contact with said first substrate and said electrically conductive pad, a second independent layer formed over and in contact with said first independent layer, and a third independent layer formed over and in contact with said second independent layer;
   forming a first dielectric layer over and in direct mechanical contact with a top surface of said passivation layer, wherein said first dielectric layer in combination with said passivation layer comprises a first opening extending from a top surface through a bottom surface of said first dielectric layer and completely through said first independent layer, said second independent layer, and said third independent layer of said passivation layer, and wherein said first dielectric layer in combination with said passivation layer comprises a second opening comprising a first portion extending from said top surface through said bottom surface of said first dielectric layer and a second portion extending completely through said first independent layer, said second independent layer, and said third independent layer of said passivation layer and over said electrically conductive pad;
   forming a first metallic pad comprising a first section formed over said passivation layer and a second section formed within said second portion of said second opening and in direct mechanical contact with said electrically conductive pad;
   forming a barrier layer comprising a first barrier layer formed over and in contact with said first metallic pad and a second barrier layer formed over and in contact with said first barrier layer;
   forming a first solder interconnect formed over and in contact with said second barrier layer;
   forming an underfill layer comprising a silica-epoxy composite adhesive material, wherein said underfill layer comprises a first underfill portion formed over said top surface of said first dielectric layer and a second underfill portion formed within an entire portion of said first opening, wherein a first portion of said dielectric layer is formed between said second underfill portion and said barrier layer, wherein said first portion of said dielectric layer is in direct mechanical contact with a bottom surface of said first barrier layer, a first surface of said electrically conductive pad, and a second surface of said electrically conductive pad, wherein said first surface of said electrically conductive pad is perpendicular to said second surface of said of said electrically conductive pad, wherein said second underfill portion is in direct mechanical contact with said first portion of said dielectric layer, a second portion of said dielectric layer, said first independent layer, said second independent layer, said third independent layer, and said first substrate, and wherein said first underfill portion is in direct mechanical contact with said first barrier layer, said second barrier layer, and said first solder interconnect; and a second substrate formed over and in contact with said underfill layer.

The present invention provides a method for forming an electrical structure comprising:
   providing a first substrate and a second substrate;
   forming a first dielectric layer over a top surface of said first substrate;
   forming a first opening extending from a top surface through a bottom surface of said first dielectric layer;
   forming a first solder structure within said first opening and over a portion of said top surface of said first dielectric layer, wherein said first solder structure comprises a solder material wherein said first solder structure is not electrically connected to said first substrate;
   forming an underfill layer over said top surface of said first dielectric layer and over said first solder structure, wherein said underfill layer comprises a silica-epoxy composite adhesive material; and
   placing said second substrate over and in contact with said underfill layer, wherein said second substrate is not in contact with said first solder structure.

The present invention advantageously provides a simple structure and associated method for proving additional means of support for connections between structures.

BRIEF DESCRIPTION OF THE DRAWINGS

FIGS. 7A-7D illustrate a process for generating the electrical structures of FIGS. 1-3, in accordance with embodiments of the present invention.

FIGS. 8A-8C illustrate a process for generating the electrical structures of FIGS. 4-6, in accordance with embodiments of the present invention.

DETAILED DESCRIPTION OF THE INVENTION

Figure 1:
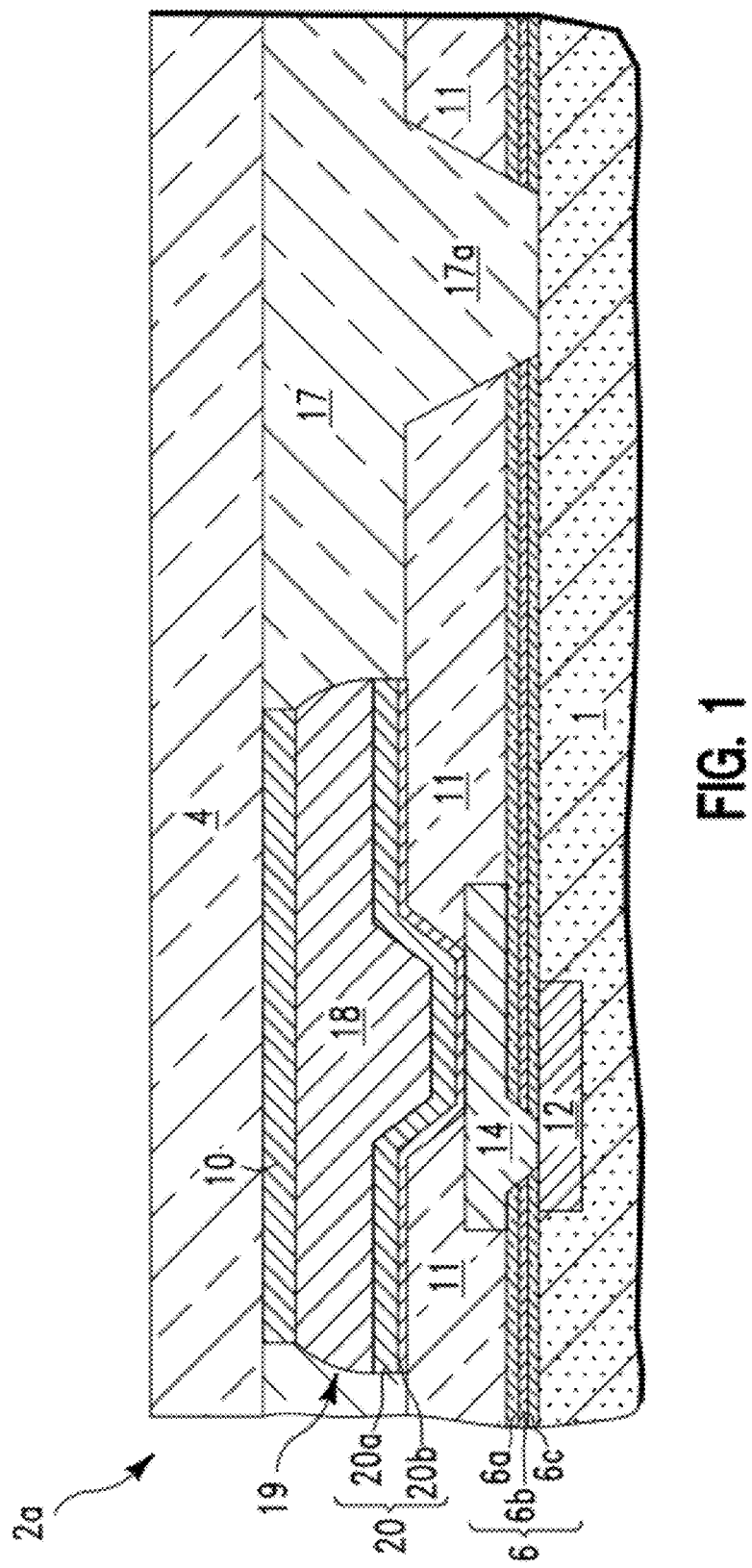
FIG. 1 illustrates a cross sectional view of an electrical structure, in accordance with embodiments of the present invention.

FIG. 1 illustrates a cross sectional view of an electrical structure 2a, in accordance with embodiments of the present invention. Electrical structure 2a comprises a substrate 1, a substrate 4, an electrical interconnection structure 19, a dielectric layer 11, layer and an underfill encapsulant layer 17. Substrate 1 comprises an electrically conductive pad 12 and an optional hard passivation layer 6. Passivation layer 6 comprises a plurality of optional layers 6a . . . 6c. Layers 6a and 6c comprise silicon nitride. Layer 6b comprises silicon dioxide. Electrically conductive pad 12 may be connected to wires or electrical components within substrate 1. Electrically conductive pad 12 may comprise any type of metallic material including, inter alia, copper. Substrate 4 comprises an electrically conductive pad 10. Electrically conductive pad 12 may be connected to wires or electrical components within substrate 4. Substrate 1 may comprise, inter alia, a semiconductor device (e.g., an integrated circuit chip, a semiconductor wafer, etc), a chip carrier (organic or inorganic), a printed circuit board, etc. Substrate 4 may comprise, inter alia, a semiconductor device (e.g., an integrated circuit chip, a semiconductor wafer, etc), a chip carrier (organic or inorganic), a printed circuit board, etc. Electrically conductive pad 10 may comprise any type of metallic material including, inter alia, copper, a chromium/copper combination, etc. Electrical interconnection structure 19 comprises a metallic pad 14, an optional barrier layer metallurgy (BLM) 20, and a solder structure 18. Electrical interconnection structure 19 electrically and mechanically connects electrically conductive pad 10 to electrically conductive pad 12 thereby connecting substrate 4 to substrate 1. Metallic pad 14 electrically and mechanically connects electrically conductive pad 12 to BLM 20. BLM 20 electrically and mechanically connects metallic pad 14 to solder structure 18. Solder structure 18 electrically and mechanically connects BLM 20 to electrically conductive pad 10. Solder structure 18 may be a C4 solder ball. Solder structure 18 comprises solder. Solder is defined herein as a metal alloy comprising a low melting point (i.e., about 100 degrees Celsius to about 340 degrees Celsius) that is used to join metallic surfaces together without melting the metallic surfaces. Solder structure 18 may comprise any solder material suitable for flip chip interconnections including, inter alia, an alloy of tin such as SnCu, SnAgCu, SnPb, etc. BLM 20 may comprise, inter alia, a layer of chromium/copper 20a and a layer of titanium 20b. Metallic pad 14 may comprise, inter alia, aluminum. Dielectric layer 11 may comprise, inter alia, a polyimide layer. Underfill encapsulant layer 17 surrounds solder structure 18 and is in contact with substrate 4. Underfill encapsulant layer 17 may comprise a material such as, inter alia, a highly filled silica-epoxy composite adhesive, a lightly filled silica-epoxy composite adhesive, etc. Underfill encapsulant layer 17 may comprise a coefficient of thermal expansion selected from a range of about 5-40 ppm/C. Underfill encapsulant layer 17 may additionally comprise a filler material dispersed throughout. Underfill encapsulant layer 17. Underfill encapsulant layer 17 comprises an anchor portion 17a. Anchor portion 17a is formed within an opening (see opening 21b in FIG. 7A) in dielectric layer 11 and optionally within passivation layer 6. The opening may comprise a single via (e.g., a through hole via) as illustrated by vias 17x in FIG. 9 or a trench as illustrated by trench 17y or 17z in FIG. 10. Underfill encapsulant layer 17 and anchor portion 17a (i.e., in combination) are used to provide support for reducing stresses on solder structure 18. Stresses on solder structure 18 may be caused by thermal cycling of electrical structure 2a.

Figure 2:
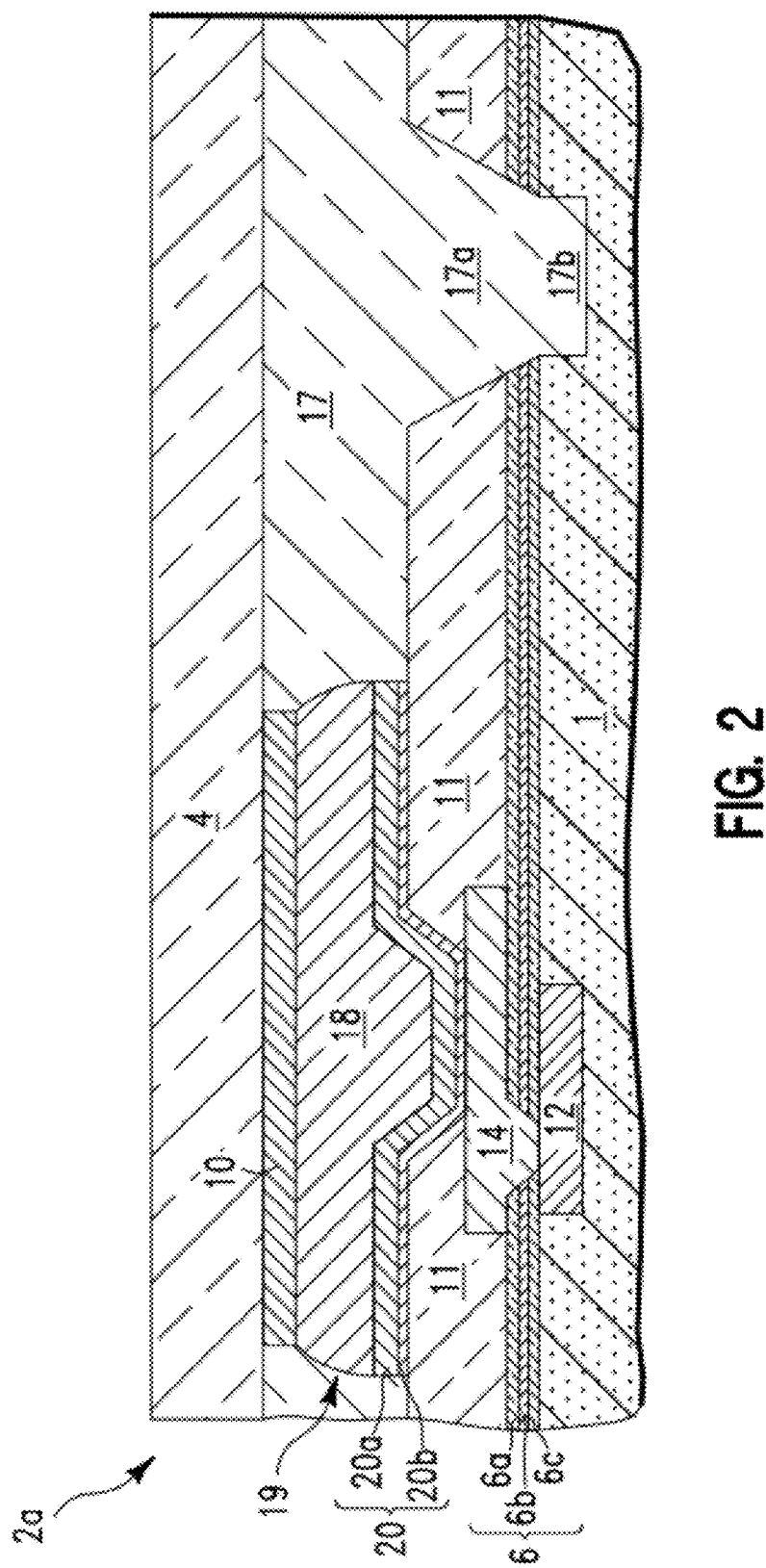
FIG. 2 depicts a first alternative to FIG. 1, in accordance with embodiments of the present invention.

FIG. 2 depicts a first alternative to FIG. 1 illustrating a cross-sectional view of an electrical structure 2b, in accordance with embodiments of the present invention. In contrast with electrical structure 2a of FIG. 1, electrical structure 2b of FIG. 2 comprises an extra portion 17b of anchor portion 17a. Extra portion 17b is formed within an opening in substrate 1. The opening may comprise a single via or a trench. Underfill encapsulant layer 17, anchor portion 17a, and extra portion 17b (i.e., in combination) are used to provide extra support for reducing stresses on solder structure 18.

Figure 3:
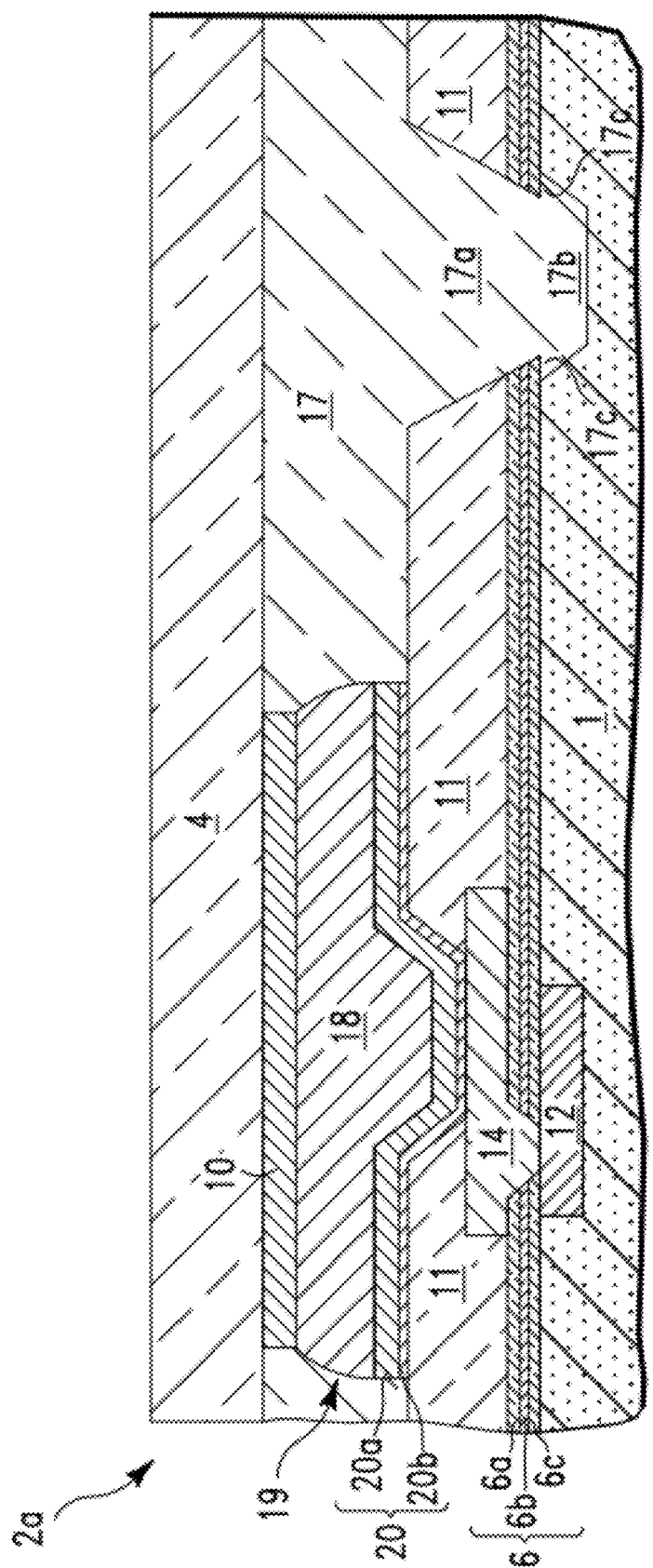
FIG. 3 depicts a first alternative to FIG. 2, in accordance with embodiments of the present invention.

FIG. 3 depicts a first alternative to FIG. 2 illustrating a cross-sectional view of an electrical structure 2c, in accordance with embodiments of the present invention. In contrast with electrical structure 2b of FIG. 2, electrical structure 2c of FIG. 3 comprises lateral portion 17c attached to extra portion 17b. Lateral portion 17c extends laterally from extra portion 17b in directions D1 and D2 such that lateral portion 17c is formed below a top surface 1a of substrate 1. Note that lateral portion 17c may extend in any direction below top surface 1a of substrate 1. Underfill encapsulant layer 17, anchor portion 17a, extra portion 17b, and lateral portion 17c (i.e., in combination) are used to provide extra support for reducing stresses on solder structure 18.

Figure 4:
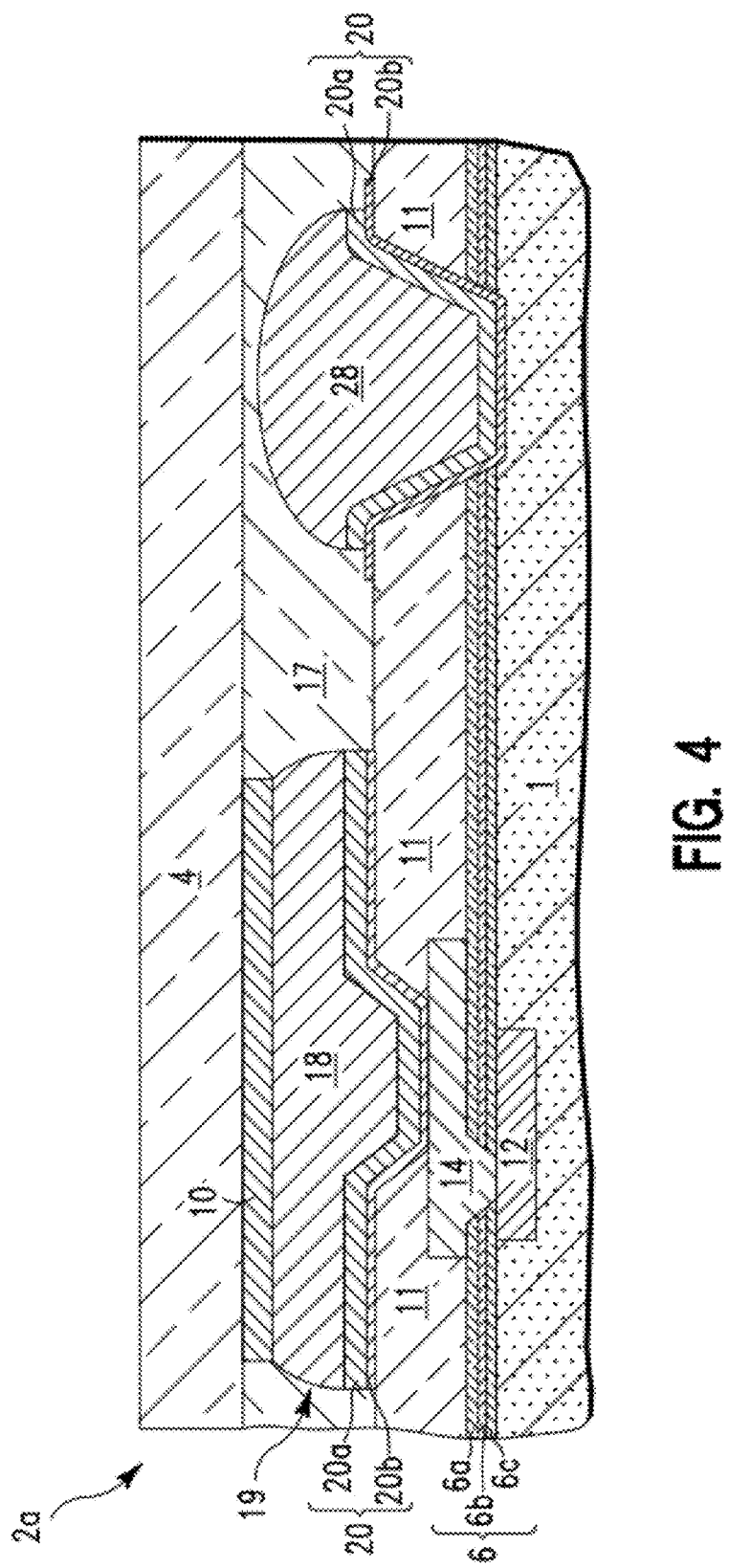
FIG. 4 illustrates a second alternative to FIG. 1, in accordance with embodiments of the present invention.

FIG. 4 illustrates a cross sectional view of an electrical structure 2d, in accordance with embodiments of the present invention. Electrical structure 2d comprises a substrate 1, a substrate 4, an electrical interconnection structure 19, a dielectric layer 11, a solder anchor structure 28, and an underfill encapsulant layer 17. Substrate 1 comprises an electrically conductive pad 12 and an optional hard passivation layer 6. Passivation layer 6 comprises a plurality of optional layers 6a . . . 6c. Layers 6a and 6c comprise silicon nitride. Layer 6b comprises silicon dioxide. Electrically conductive pad 12 may be connected to wires or electrical components within substrate 1. Electrically conductive pad 12 may comprise any type of metallic material including, inter alia, copper. Substrate 4 comprises an electrically conductive pad 10. Electrically conductive pad 12 may be connected to wires or electrical components within substrate 4. Substrate 1 may comprise, inter alia, a semiconductor device (e.g., an integrated circuit chip, a semiconductor wafer, etc), a chip carrier (organic or inorganic), a printed circuit board, etc. Substrate 4 may comprise, inter alia, a semiconductor device (e.g., an integrated circuit chip, a semiconductor wafer, etc), a chip carrier (organic or inorganic), a printed circuit board, etc. Electrically conductive pad 10 may comprise any type of metallic material including, inter alia, copper, a chromium/ copper combination, etc. Electrical interconnection structure 19 comprises a metallic pad 14, an optional barrier layer metallurgy (BLM) 20, and a solder structure 18. Electrical interconnection structure 19 electrically and mechanically connects electrically conductive pad 10 to electrically conductive pad 12 thereby connecting substrate 4 to substrate 1. Metallic pad 14 electrically and mechanically connects electrically conductive pad 12 to BLM 20. BLM 20 electrically and mechanically connects metallic pad 14 to solder structure 18. Solder structure 18 electrically and mechanically connects BLM 20 to electrically conductive pad 10. Solder structure 18 may be a C4 solder ball. Solder structure 18 comprises solder. Solder is defined herein as a metal alloy comprising a low melting point (i.e., about 100 degrees Celsius to about 340 degrees Celsius) that is used to join metallic surfaces together without melting the metallic surfaces. Solder structure 18 may comprise any solder material suitable for flip chip interconnections including, inter alia, an alloy of tin such as SnCu, SnAgCu, SnPb, etc. BLM 20 may comprise, inter alia, a layer of chromium/copper 20a and a layer of titanium 20b. Metallic pad 14 may comprise, inter alia, aluminum. Dielectric layer 11 may comprise, inter alia, a polyimide layer. Underfill encapsulant layer 17 surrounds solder structure 18 and solder anchor structure 28 and is in contact with substrate 4. Underfill encapsulant layer 17 may comprise, inter alia, a highly filled silica-epoxy composite adhesive, a lightly filled silica-epoxy composite adhesive, etc. Underfill encapsulant layer 17 may comprise a coefficient of thermal expansion selected from a range of about 5-40 ppm/C. Underfill encapsulant layer 17 may additionally comprise a filler material dispersed throughout. Underfill encapsulant layer 17. Solder anchor structure 28 is formed within an opening (see opening 21b in FIG. 7A) in dielectric layer 11 and optionally within passivation layer 6. The opening may comprise a single via (e.g., a through hole via) as illustrated by vias 17x in FIG. 9 or a trench as illustrated by trench 17y or 17z in FIG. 10. BLM 20 may optionally be located between solder anchor structure 28 and the opening. Solder anchor structure 28 is not in contact with substrate 4 (i.e., as illustrated in FIG. 4). Alternatively, solder anchor structure 28 may be in contact with substrate 4 (i.e., not shown). Solder anchor structure 28 is not in electrical contact with any electrical components (e.g., transistors resistors, capacitors, wires, etc) in substrate 4 or substrate 1. Solder anchor structure 28 may comprise any solder material including, inter alia, an alloy of tin such as SnCu, SnAgCu, SnPb, etc. Underfill encapsulant layer 17 and solder anchor structure 28 (i.e., in combination) are used to provide support for reducing stresses on solder structure 18. Stresses on solder structure 18 may be caused by thermal cycling of electrical structure 2a.

Figure 5:
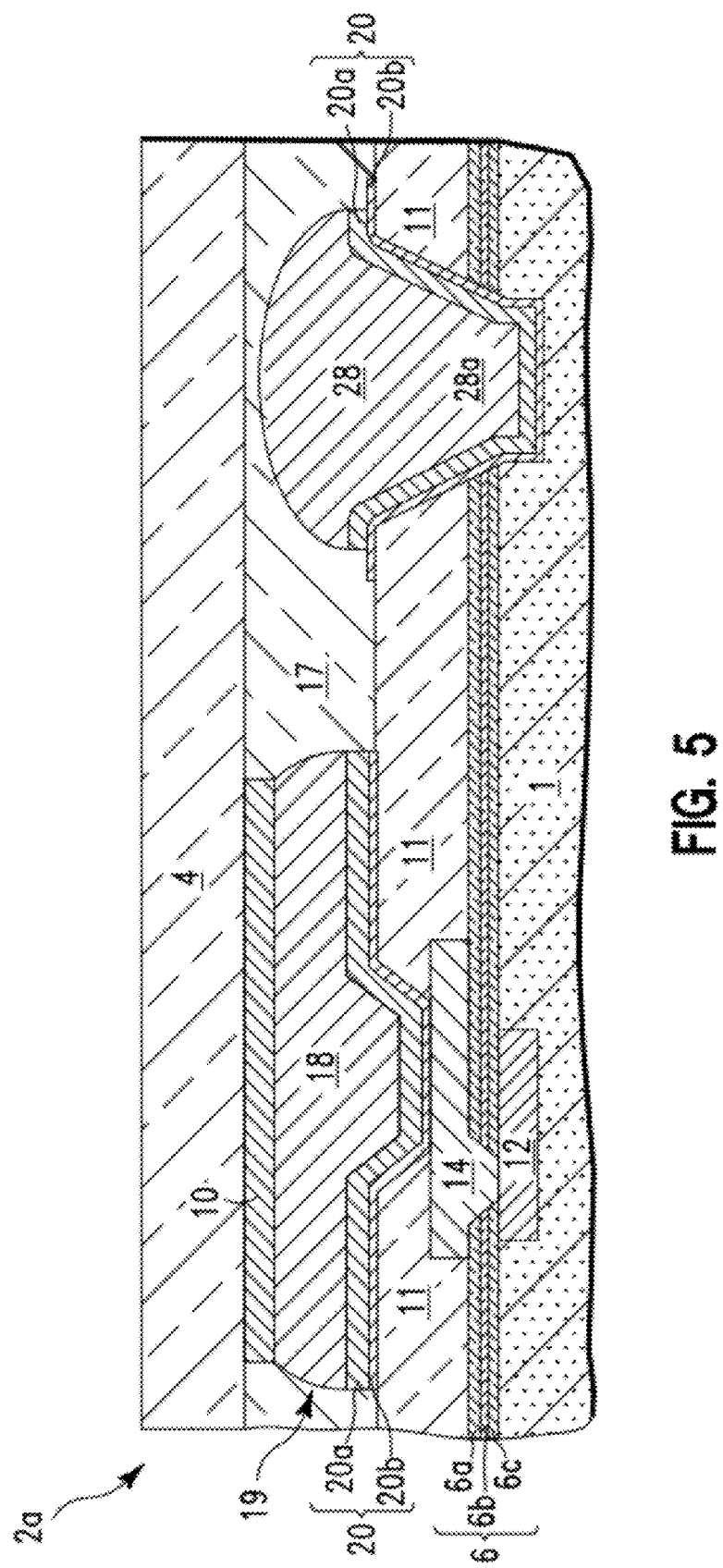
FIG. 5 illustrates a first alternative to FIG. 4, in accordance with embodiments of the present invention.

FIG. 5 depicts a first alternative to FIG. 4 illustrating a cross-sectional view of an electrical structure 2e, in accordance with embodiments of the present invention. In contrast with electrical structure 2d of FIG. 4, electrical structure 2e of FIG. 5 comprises an extra portion 28a of solder anchor structure 28. Extra portion 28a is formed within an opening in substrate 1. The opening may comprise a single via or a trench. Underfill encapsulant layer 17, solder anchor structure 28, and extra portion 28a (i.e., in combination) are used to provide extra support for reducing stresses on solder structure 18.

Figure 6:
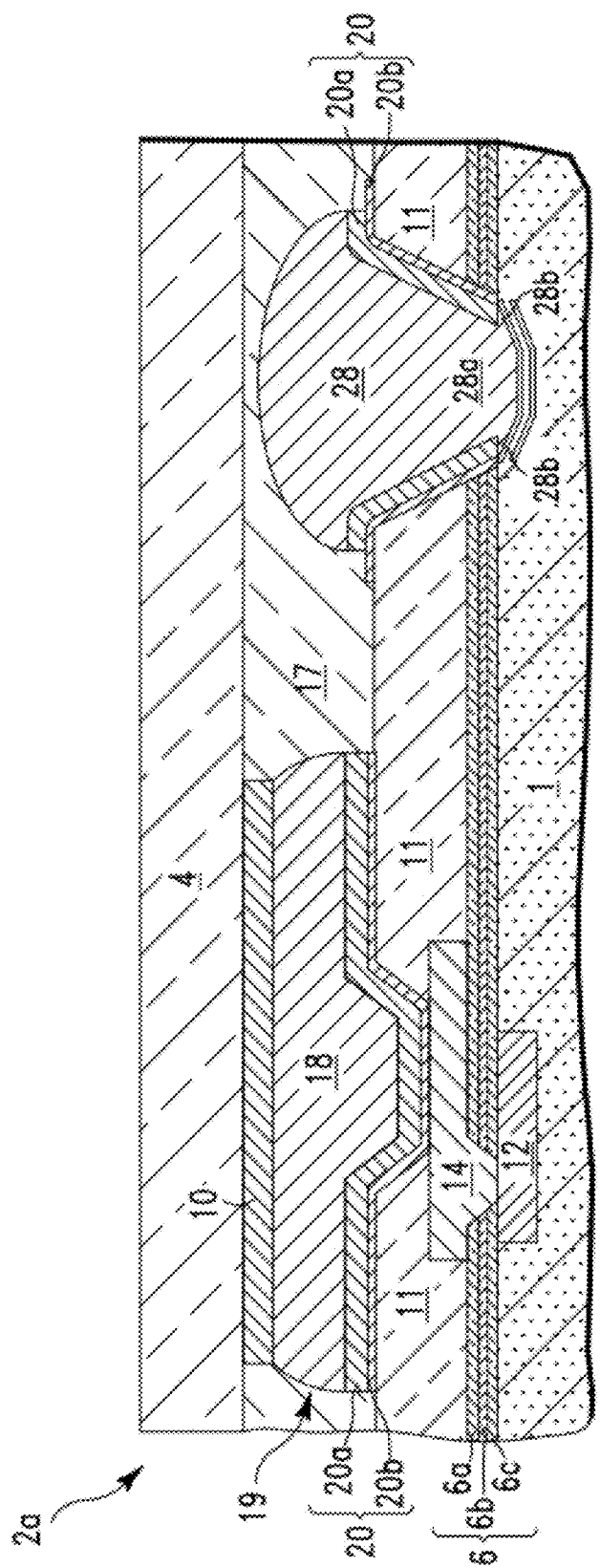
FIG. 6 illustrates a first alternative to FIG. 5, in accordance with embodiments of the present invention.

FIG. 6 depicts a first alternative to FIG. 5 illustrating a cross-sectional view of an electrical structure 2f, in accordance with embodiments of the present invention. In contrast with electrical structure 2e of FIG. 5, electrical structure 2f of FIG. 6 comprises lateral portion 28b attached to extra portion 28a. Lateral portion 28b extends laterally from extra portion 28a in directions D1 and D2 such that lateral portion 28b is formed below a top surface 1a of substrate 1. Note that lateral portion 28b may extend in any direction below top surface 1a of substrate 1. Underfill encapsulant layer 17, solder anchor structure 28, and extra portion 28a and lateral portion 28b (i.e., in combination) are used to provide extra support for reducing stresses on solder structure 18.

FIGS. 7A-7D illustrate a process for generating electrical structures 2a-2c of FIGS. 1-3, in accordance with embodiments of the present invention.

FIG. 7A illustrates a cross sectional view of a formation of openings 21a and 21b, in accordance with embodiments of the present invention. Metallic pad 14 is formed by metal deposition, lithography, and a resistive ion etch (RIE) process. Dielectric layer 11 may be formed by a spin-on baking process. Openings 21a and 21b may be formed by an exposing, developing, and curing process. An RIE process may be used to etch through passivation layer 6.

FIG. 7B illustrates a cross sectional view of a formation of solder structure 18a, in accordance with embodiments of the present invention. BLM 20 may be formed by using a sputter deposition process. BLM 20 may comprise a thickness of about 0.5 um. Resist layer 30 is applied and on opening in resist layer 30 is formed for solder structure 18a. Solder structure 18a is formed by an electroplating process.

FIG. 7C illustrates a cross sectional view of the structure illustrated in FIG. 7B after resist layer 30 has been stripped away and opening 21b has been formed, in accordance with embodiments of the present invention.

FIG. 7D illustrates a cross sectional view of the structure illustrated in FIG. 7C after solder structure 18 has been formed by reflowing solder structure 18a, in accordance with embodiments of the present invention. In order to generate structures 2a-2c of FIGS. 1-3 from the structure illustrated in FIG. 7D:

1. Substrate 4 is connected to solder structure 18.
2. Underfill encapsulant layer 17 is dispensed.

Figure 8C:
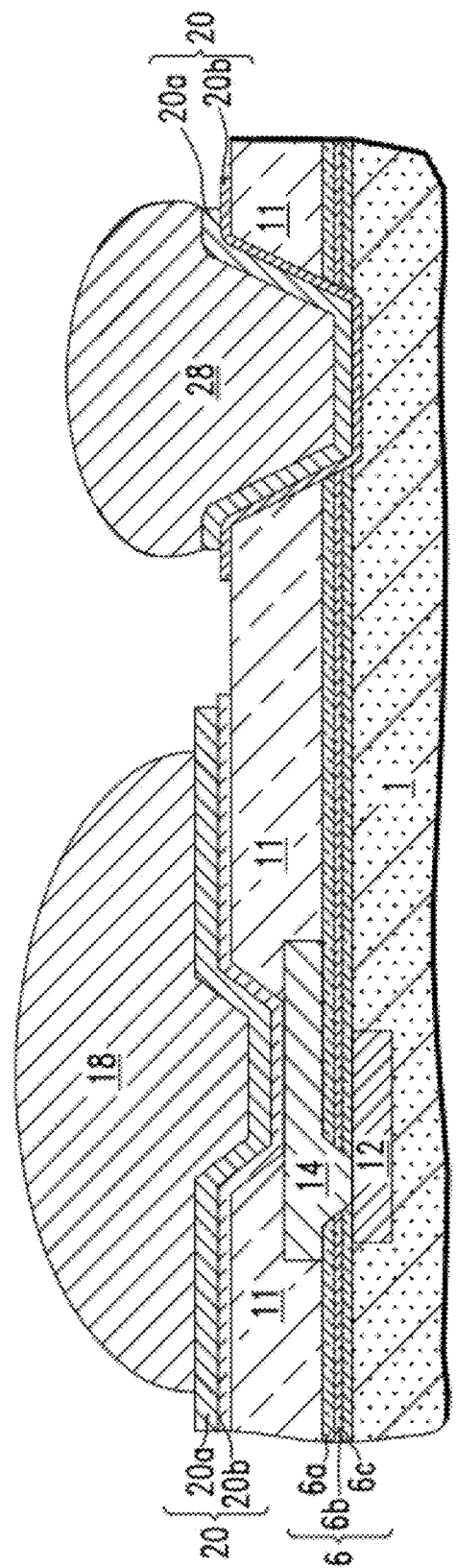

FIGS. 8A-8C illustrate a process for generating electrical structures 2d-2f of FIGS. 4-6, in accordance with embodiments of the present invention.

FIG. 8A illustrates a cross sectional view of a formation of openings 21a and 21b, in accordance with embodiments of the present invention. Metallic pad 14 is formed by metal deposition, lithography, and a resistive ion etch (RIE) process. Dielectric layer 11 may be formed by a spin-on baking process. Openings 21a and 21b may be formed by an exposing, developing, and curing process. An RIE process may be used to etch through passivation layer 6.

FIG. 8B illustrates a cross sectional view of a formation of solder structure 18a and solder structure 28c, in accordance with embodiments of the present invention. BLM 20 may be formed by using a sputter deposition process. BLM 20 may comprise a thickness of about 0.5 um. Resist layer 30 is applied and on opening in resist layer 30 is formed for solder structure 18a and solder structure 28a. Solder structure 18a and solder structure 28c is formed by an electroplating process.

FIG. 8C illustrates a cross sectional view of the structure illustrated in FIG. 8B after solder structure 18 has been formed by reflowing solder structure 18a and solder structure 28 has been formed by reflowing solder structure 28c, in accordance with embodiments of the present invention. In order to generate structures 2d-2f of FIGS. 4-6 from the structure illustrated in FIG. 8B:

1. Substrate 4 is connected to solder structure 18.
2. Underfill encapsulant layer 17 is dispensed.

Figure 9:
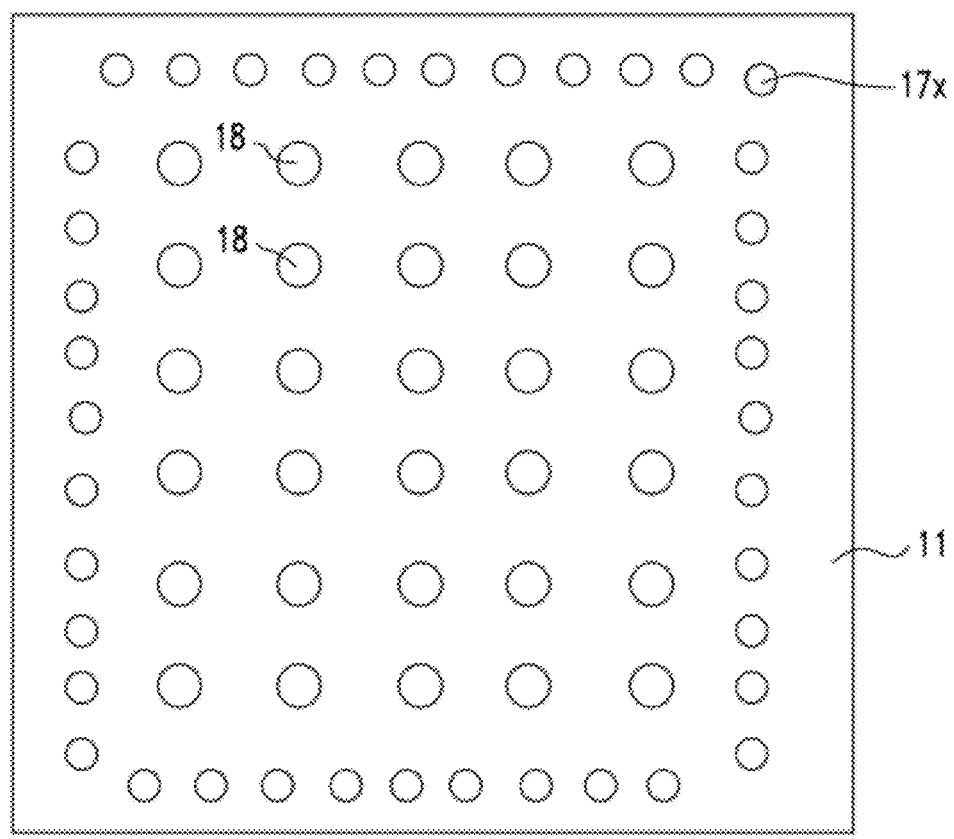
FIG. 9 illustrates a top view of the electrical structures of FIGS. 1-6, in accordance with embodiments of the present invention.

FIG. 9 illustrates a top view of electrical structures 2a-2f of FIGS. 1-6, in accordance with embodiments of the present invention. Structures 17x illustrate either anchor portion 17a of underfill encapsulant layer 17 or extra portion 28a of solder anchor structure 28. Structures 17x are formed within vias.

Figure 10:
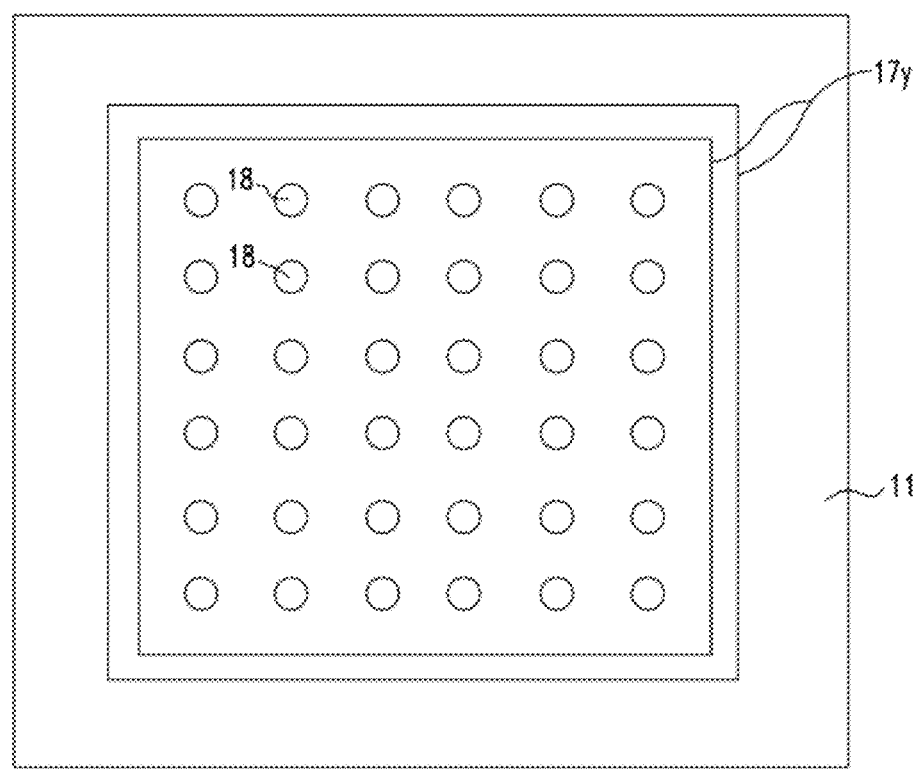
FIG. 10 illustrates an alternative top view of the electrical structures of FIGS. 1-6, in accordance with embodiments of the present invention.

FIG. 10 illustrates an alternative top view of electrical structures 2a-2f of FIGS. 1-6, in accordance with embodiments of the present invention. Structures 17y illustrate either anchor portion 17a of underfill encapsulant layer 17 or extra portion 28a of solder anchor structure 28. Structures 17y are formed within trenches.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An electrical structure comprising:
   a first substrate;
   a first dielectric layer formed over a top surface of said first substrate, wherein said first dielectric layer comprises a first opening extending from a top surface through a bottom surface of said first dielectric layer and a second opening extending from a top surface through a bottom surface of said first dielectric layer;
   a first solder structure formed within said first opening and over a portion of said top surface of said first dielectric layer, wherein said first solder structure comprises a solder material, wherein said first solder structure is not electrically connected to said first substrate;
   a first metallic pad comprising a first section formed within said second opening and in direct mechanical contact with an electrically conductive pad;
   a barrier layer structure comprising a first barrier layer formed over and in contact with said first metallic pad and a second barrier layer formed over and in contact with said first barrier layer;
   an underfill layer comprising a silica-epoxy composite adhesive material, wherein said underfill layer is formed over said top surface of said first dielectric layer and over said first solder structure, wherein said underfill layer is formed over said top surface of said first dielectric layer and over solder structure, wherein a first portion of said dielectric layer is formed between said solder structure and said barrier layer structure, wherein said first portion of said dielectric layer is in direct mechanical contact with a bottom surface of said first barrier layer, a first surface of said first metallic pad, and a second surface of said first metallic pad, wherein said underfill layer is in direct mechanical contact with said first portion of said dielectric layer, a second portion of said dielectric layer, said first solder structure, said first barrier layer, and said second barrier layer;
   a second substrate formed over and in contact with said underfill layer, wherein said second substrate is not in contact with said first solder structure, and wherein a portion of said underfill layer is formed in contact with and between a bottom surface of said second substrate and a top surface of said first solder structure; and
   a barrier layer formed within said first opening between a portion of said first solder structure and said first dielectric layer, wherein said first opening extends through said top surface of said first substrate and within an opening within said first substrate, wherein said barrier layer is formed within a portion of said opening, wherein said first solder structure is further formed within said opening, and wherein said barrier layer is further formed between said first solder structure and said first substrate within said opening.

2. The electrical structure of claim 1, wherein said barrier layer comprises a first independent layer and a second independent layer.

3. The electrical structure of claim 2, wherein said first independent layer comprises a chromium/copper layer, and wherein said second independent layer comprises a titanium layer.

4. The electrical structure of claim 1, wherein said first opening is a first via.

5. The electrical structure of claim 4, further comprising:
   a plurality of vias, wherein each of said plurality of vias extends from said top side through said bottom side of said first dielectric layer, wherein said first via and each via of said plurality of vias is located adjacent to and within a perimeter of said first dielectric layer such that said plurality of vias and said first via in combination form a perimeter surrounding a plurality of solder interconnects, wherein said plurality of solder interconnects electrically and mechanically connect a first plurality of electrically conductive pads on said first substrate to a second plurality of electrically conductive pads on said second substrate; and
   a plurality of solder structures, wherein each solder structure of said plurality of solder structures is formed within an associated via of said plurality of vias, wherein said plurality of solder structures are not electrically connected to said first substrate, wherein said underfill layer is formed over said plurality of solder structures, and wherein said plurality of solder structures are not in contact with said second substrate.

6. The electrical structure of claim 5, wherein said opening within said first substrate extends laterally such that a portion of said opening is located below said top surface of said first substrate, wherein said first solder structure is formed within said portion of said opening located below said top surface of said first substrate and said barrier layer is further formed between said first solder structure and said first substrate within said portion of said opening located below said top surface of said first substrate.

7. The electrical structure of claim 1, wherein said first opening is a trench, wherein said trench comprises a geometric configuration such that said trench is located adjacent to and within a perimeter of said first dielectric layer, wherein said trench forms a perimeter surrounding a plurality of solder interconnects, wherein said plurality of solder interconnects electrically and mechanically connect a first plurality of electrically conductive pads on said second substrate.

8. The electrical structure of claim 7, wherein said opening within said first substrate extends laterally such that a portion of said opening is located below said top surface of said first substrate wherein said first solder structure is formed within said portion of opening located below said top surface of said first substrate and said barrier layer is further formed between said first solder structure and said first substrate within said portion of said opening located below said top surface of said first substrate.

9. A method for forming an electrical structure comprising:
   providing a first substrate and a second substrate;
   forming a electrically conductive pad formed within said first substrate, wherein said electrically conductive pad comprises a metallic pad;
   forming a passivation layer over and in direct mechanical contact with a top surface of said first substrate, wherein said passivation layer comprises a first independent layer formed over and in contact with said first substrate and said electrically conductive pad, a second independent layer formed over and in contact with said first independent layer, and a third independent layer formed over and in contact with said second independent layer; forming a first dielectric layer over and in direct mechanical contact with a top surface of said passivation layer, wherein said first dielectric layer in combination with said passivation layer comprises a first opening extending from a top surface through a bottom surface of said first dielectric layer and completely through said first independent layer, said second independent layer, and said third independent layer of said passivation layer, and wherein said first dielectric layer in combination with said passivation layer comprises a second opening comprising a first portion extending from said top surface through said bottom surface of said first dielectric layer and a second portion extending completely through said first independent layer, said second independent layer, and said third independent layer of said passivation layer and over said electrically conductive pad;

forming a first metallic pad comprising a first section formed over said passivation layer and a second section formed within said second portion of said second opening and in direct mechanical contact with said electrically conductive pad;

forming a barrier layer comprising a first barrier layer formed over and in contact with said first metallic pad and a second barrier layer formed over and in contact with said first barrier layer;

forming a first solder interconnect formed over and in contact with said second barrier layer;

forming an underfill layer comprising a silica-epoxy composite adhesive material, wherein said underfill layer comprises a first underfill portion formed over said top surface of said first dielectric layer and a second underfill portion formed within an entire portion of said first opening, wherein a first portion of said dielectric layer is formed between said second underfill portion and said barrier layer, wherein said first portion of said dielectric layer is in direct mechanical contact with a bottom surface of said first barrier layer, a first surface of said first metallic pad, and a second surface of said first metallic pad, wherein said first surface of said first metallic pad is perpendicular to said second surface of said of said first metallic pad, wherein said second underfill portion is in direct mechanical contact with said first portion of said dielectric layer, a second portion of said dielectric layer, said first independent layer, said second independent layer, said third independent layer, and said first substrate, and wherein said first underfill portion is in direct mechanical contact with said first barrier layer, said second barrier layer, and said first solder interconnect; and a second substrate formed over and in contact with said underfill layer.

10. The method of claim 9, wherein said forming said first opening further comprises extending said first opening through said top surface of said first substrate and within a first portion of said first substrate, and wherein forming said underfill layer further comprises forming said underfill layer within said first portion of said first substrate.

11. A method for forming an electrical structure comprising:

providing a first substrate and a second substrate;

forming a first dielectric layer over a top surface of said first substrate;

forming a first opening extending from a top surface through a bottom surface of said first dielectric layer;

forming a second opening extending from a top surface through a bottom surface of said first dielectric layer;

forming a first solder structure within said first opening and over a portion of said top surface of said first dielectric layer, wherein said first solder structure comprises a solder material, wherein said first solder structure is not electrically connected to said first substrate;

forming a first metallic pad comprising a first section within said second opening and in direct mechanical contact with an electrically conductive pad;

forming a barrier layer structure comprising a first barrier layer formed over and in contact with said first metallic pad and a second barrier layer formed over and in contact with said first barrier layer;

forming an underfill layer over said top surface of said first dielectric layer and over said first solder structure, wherein said underfill layer comprises a silica-epoxy composite adhesive material, wherein said underfill layer is formed over said top surface of said first dielectric layer and over said solder structure, wherein a first portion of said dielectric layer is formed between said solder structure and said barrier layer structure, wherein said first portion of said dielectric layer is in direct mechanical contact with a bottom surface of said first barrier layer, a first surface of said first metallic pad, and a second surface of said first metallic pad, wherein said underfill layer is in direct mechanical contact with said first portion of said dielectric layer, a second portion of said dielectric layer, said first solder structure, said first barrier layer, and said second barrier layer;

placing said second substrate over and in contact with said underfill layer, wherein said second substrate is not in contact with said first solder structure, wherein a portion of said underfill layer is formed in contact with and between a bottom surface of said second substrate and a top surface of said first solder structure; and forming a barrier layer within said first opening between a portion of said first solder structure and said first dielectric layer, wherein said first opening extends through said top surface of said first substrate and within an opening within said first substrate, wherein said barrier layer is formed within a portion of said opening, wherein said first solder structure is further formed within said opening, and wherein said barrier layer is further formed between said first solder structure and said first substrate within said opening.

12. The method of claim 11, wherein said first opening is a first via.

* * * * *